United States Patent
Kuo

(10) Patent No.: US 9,664,732 B2
(45) Date of Patent: May 30, 2017

(54) RF DEVICE AND SWITCHING CONTROL PERFORMED THEREIN

(71) Applicant: Alpha Networks Inc., Hsinchu (TW)

(72) Inventor: Rong-Fa Kuo, Hsinchu (TW)

(73) Assignee: ALPHA NETWORKS INC., Hsinchu (TW)

( * ) Notice: Subject to any disclaimer, the term of this patent is extended or adjusted under 35 U.S.C. 154(b) by 71 days.

(21) Appl. No.: 14/884,125

(22) Filed: Oct. 15, 2015

(65) Prior Publication Data

US 2016/0109511 A1    Apr. 21, 2016

(30) Foreign Application Priority Data

Oct. 21, 2014  (TW) .............................. 103136353 A

(51) Int. Cl.
G01R 31/28    (2006.01)

(52) U.S. Cl.
CPC ..... *G01R 31/2884* (2013.01); *G01R 31/2822* (2013.01); *G01R 31/2818* (2013.01)

(58) Field of Classification Search
CPC ............ G01R 31/2884; G01R 31/2822; G01R 31/2818; H04B 17/19; H04B 17/29; H04B 17/18
See application file for complete search history.

(56) References Cited

U.S. PATENT DOCUMENTS 7,317,379 B2    1/2008  Kimura
9,479,271 B2 *  10/2016 Kuo ....................... H04B 17/19

FOREIGN PATENT DOCUMENTS

| CN | 102141593 |   | 6/2013 |   |
| TW | M242864   | * | 5/2003 | ............... H01Q 3/24 |
| TW | M242864   |   | 9/2004 |   |

* cited by examiner

*Primary Examiner* — Julian Huffman
*Assistant Examiner* — Michael Konczal
(74) *Attorney, Agent, or Firm* — WPAT, PC; Justin King

(57) ABSTRACT

In an RF device, an RF circuit includes at least two RF transmitting/receiving elements; and an RF switch controlled to selectively electrically couple to one of the RF transmitting/receiving elements for transmitting/receiving an RF signal in response to a control signal. In addition, a testing circuit includes a first filter unit having a first external terminal electrically coupled to a testing signal and a second external terminal electrically coupled to the RF circuit, wherein the first filter unit is configured to allow the testing signal to enter the RF circuit while blocking an RF signal transmitted in the RF circuit from entering the testing circuit; and a testing-result informing unit having an external input electrically coupled to the first external terminal, and determining contents of the control signal according to an electric level at the external input.

14 Claims, 9 Drawing Sheets

RF DEVICE AND SWITCHING CONTROL PERFORMED THEREIN

FIELD OF THE INVENTION

The present invention relates to automatic switching control of a radio frequency (RF) circuit, and more particularly to a self-testing RF device and a method of automatically selecting and switching RF terminals in a self-testing RF device.

BACKGROUND OF THE INVENTION

Many indoor communication products are equipped with an optional connector for connecting thereto an external RF transmitting/receiving element in addition to a standard built-in RF transmitting/receiving element, e.g. an antenna, for adaptively enhancing quality of RF transmitting/receiving signals passing through the terminals in various environments. Generally, an RF switch is disposed between the built-in transmitter/receiver element and the external transmitter/receiver element and functions for selecting one of the built-in transmitter/receiver element and the external transmitter/receiver element to conduct the RF transmitting/receiving operation. Such RF switch is generally so-called as an RF switch connector.

So far, mechanical types of RF switches have been use in prior art. Such RF switches are generally integrated into RF connectors to function as the above-mentioned RF switch connectors. Before a detachable RF transmitting/receiving element is coupled to the RF switch connector, a built-in RF transmitting/receiving element is connected to the RF switch connector for default communication. Afterwards, during the inserting operation of the external RF transmitting/receiving element into the RF switch connector, a force will be exerted onto a mechanical switching member inside the switch so as to switch the RF transmitting/receiving path from a terminal associated with the built-in RF transmitting/receiving element into a terminal associated with the external RF transmitting/receiving element. In this way, the built-in RF transmitting/receiving element and the external RF transmitting/receiving element can operate selectively, depending on practical requirements.

In practice, there are some problems encountered by a mechanical switch. First of all, since the RF switch connector is preset to couple to a built-in RF transmitting/receiving element, a switching operation of terminals is necessarily performed when it is a detachable RF transmitting/receiving element to be connected instead. However, the detection of the detachable RF transmitting/receiving element might be problematic. For example, a poor contact state between the detachable RF transmitting/receiving element and the RF switch connector is hard to be found from the detection data of an ordinary multimeter if the detachable RF transmitting/receiving element and the built-in RF transmitting/receiving element are both open circuits connected in series. Furthermore, since the contacts of the detachable RF transmitting/receiving element and the RF switch connector are generally disposed inside the RF switch connector, it is difficult to execute contact detection with a probe.

Furthermore, if the detachable RF transmitting/receiving element is an internally connected RF transmitting/receiving element, the allocation of the detachable RF transmitting/receiving element and the built-in RF transmitting/receiving element would be limited by the mechanical RF switch connector. For example, considering respective dimensions and functions of the detachable RF transmitting/receiving element and the built-in RF transmitting/receiving element, the detachable RF transmitting/receiving element and the built-in RF transmitting/receiving element disposed both inside the RF device are supposed to have a specified wire distance to the connector. Therefore, wire cost and wire routing space would be increased and undesirable transmission power loss would be caused.

SUMMARY OF THE INVENTION

Therefore, the present invention provides an RF device, in which the external RF transmitter/receiver element and the built-in RF transmitter/receiver element can be automatically selected and switched. Meanwhile, whether the external RF transmitter/receiver element or the RF switch connector is well connected can be detected.

The present invention further provides a method of automatically selecting and switching RF terminals in an RF device for transmitting/receiving an RF signal properly through an external RF transmitter/receiver element or a built-in RF transmitter/receiver element.

An aspect of the present invention relates to an RF device, which comprises an RF circuit for transmitting or receiving an RF signal, and a testing circuit. The RF circuit comprises at least two RF transmitting/receiving elements; and an RF switch controlled electrically for coupling to a selected RF transmitting/receiving element among them to transmit/receive an RF signal to/from the selected RF transmitting/receiving element in response to a control signal. The testing circuit comprises a first filter unit having a first external terminal electrically coupled to a testing signal and a second external terminal electrically coupled to the RF circuit, wherein the first filter unit is configured to allow the testing signal to enter the RF circuit while blocking an RF signal transmitted in the RF circuit from entering the testing circuit; and a testing-result informing unit having an external input electrically coupled to the first external terminal, and determining contents of the control signal according to an electric level at the external input.

In an embodiment, the RF transmitting/receiving elements include at least one built-in RF transmitting/receiving element, and at least one RF connector coupled to a detachable RF transmitting/receiving element.

Another aspect of the present invention relates to a method of automatically selecting and switching RF terminals in the above RF device. The method comprises: comparing an electric level at the external input of the testing-result informing unit with at least one reference electric level to obtain a compared result; and determining the contents of the control signal according to the compared result.

In an embodiment, the contents of the control signal are determined by comparing the compared result with a conditional sequence. The conditional sequence is previously obtained by comparing the electric level at the external input of the testing-result informing unit with the at least one reference electric level on condition that a detachable RF transmitting/receiving element is successfully connected to the external RF connector of the RF circuit. The RF switch is electrically coupled to the external RF connector in response to the control signal so that the RF signal transmitted/received passes through the detachable RF transmitting/receiving element if the compared result is consistent with the conditional sequence. On the other hand, a warning signal is issued if the compared result is inconsistent with the conditional sequence.

In another embodiment, the contents of the control signal are determined by comparing the compared result with a conditional sequence, which is previously obtained by comparing the electric level at the external input of the testing-result informing unit with the at least one reference electric level on conditions that the RF circuit functions normally and there is no detachable RF transmitting/receiving element connected to the external RF connector of the RF circuit. The RF switch is controlled, in response to the control signal, to be electrically disconnecting to the external RF connector so as to block the RF signal from coupling to the RF connector if the compared result is inconsistent with the conditional sequence. On the other hand, a warning signal is issued if the compared result is inconsistent with the conditional sequence.

BRIEF DESCRIPTION OF THE DRAWINGS

The invention will become more readily apparent to those ordinarily skilled in the art after reviewing the following detailed description and accompanying drawings, in which.

DETAILED DESCRIPTION OF PREFERRED EMBODIMENTS

The invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
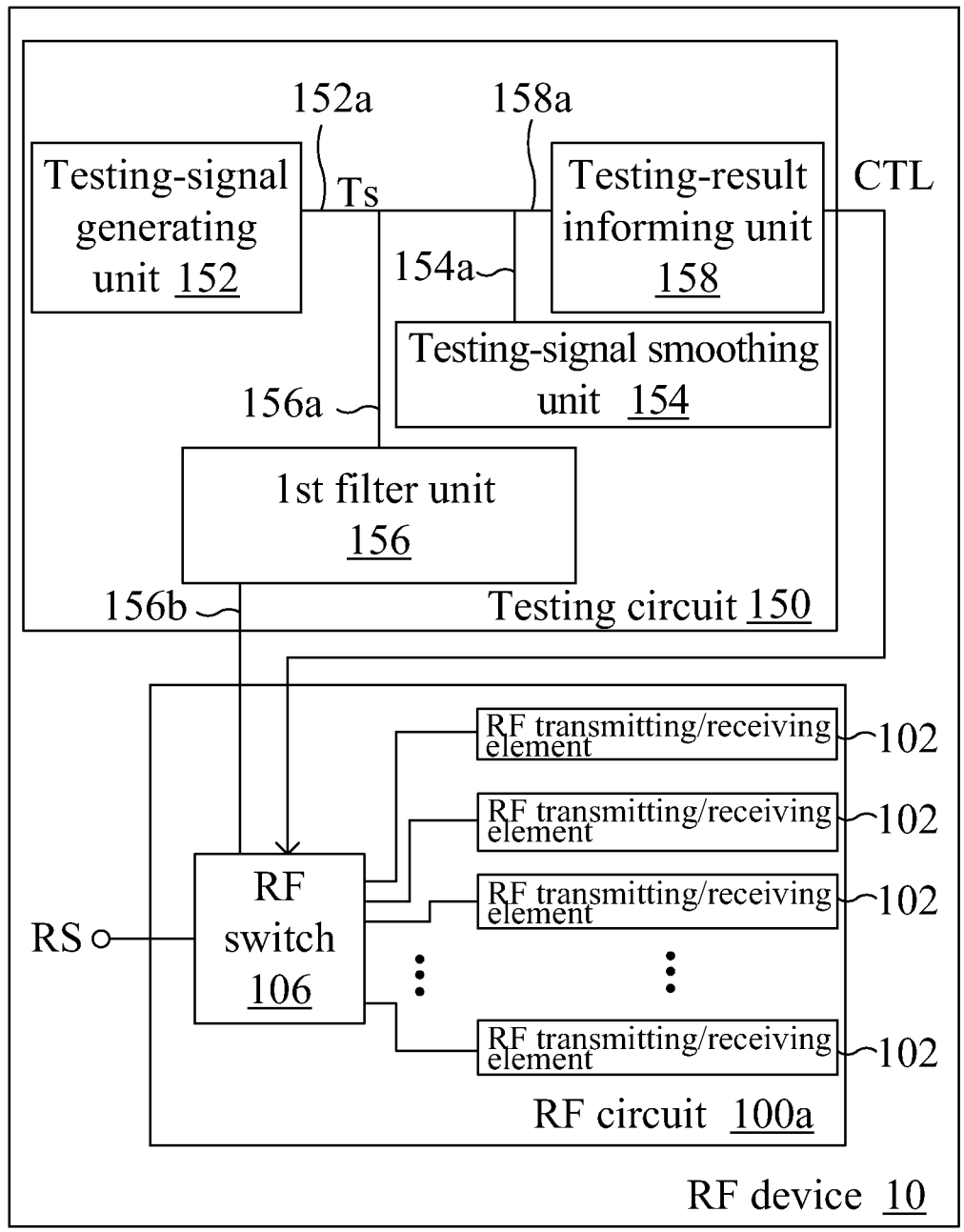
FIG. 1A is a schematic circuit block diagram of an RF device according to an embodiment of the present invention.

Please refer to FIG. 1A. An RF device 10 according to an embodiment of the present invention includes an RF circuit 100a and a testing circuit 150 for testing the RF circuit 100a. The RF circuit 100a functions for transmitting/receiving radiofrequency signals RS, and includes a plurality of RF transmitting/receiving elements 102 and an RF switch 106. The testing circuit 150 includes a testing-signal generating unit 152, a testing-signal smoothing unit 154, a first filter unit 156 and a testing-result informing unit 158.

As shown in FIG. 1A, the RF switch 106 of the RF circuit 100a is electrically coupled to the plurality of RF transmitting/receiving elements 102, and controlled to transmit/receive the radiofrequency signal RS via one of the RF transmitting/receiving elements 102. On the other hand, a testing wire extending from the testing circuit 150 is electrically coupled to at least one terminal of the RF switch 106 to detect an electric characteristic at the specified terminal. According to the electric characteristic, a control signal CTL is generated and inputted to the RF switch 106 to select a corresponding one of the RF transmitting/receiving elements 102 for transmitting/receiving the RF signal RS. The RF switch 106 in this embodiment is separated from each of the RF transmitting/receiving elements 102. Alternatively, the RF switch 106 may also be integrated with any of the RF transmitting/receiving elements 102, if the circuitry and structure designs are proper.

Figure 1B:
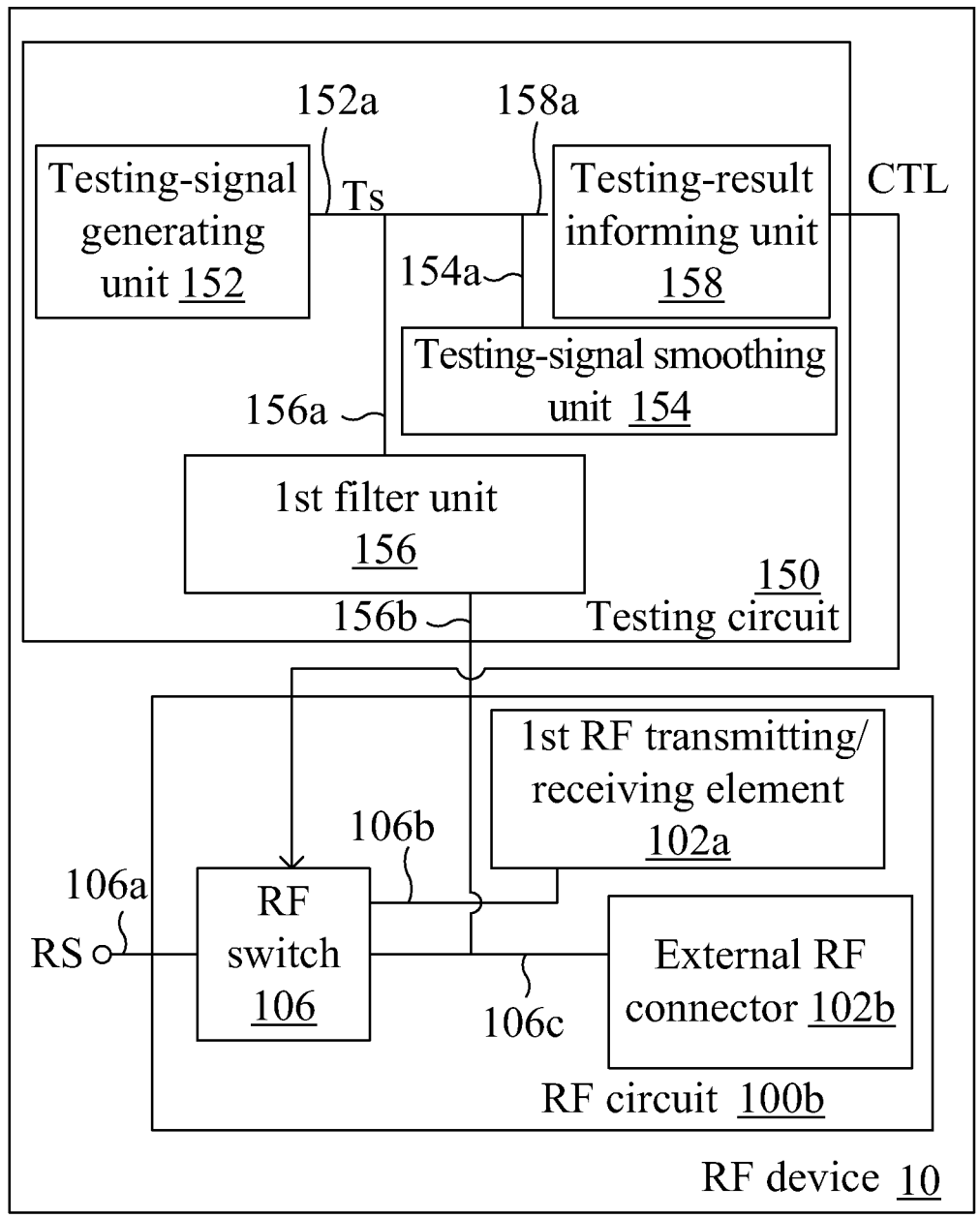
FIG. 1B is schematic circuit block diagram of an example of the RF device as shown in FIG. 1A.

Further referring to FIG. 1B, an extensive example of the RF device as shown in FIG. 1A is illustrated. For simplicity, a built-in RF transmitting/receiving element (hereinafter, first transmitting/receiving element) 102a and an external RF connector 102b for coupling thereto a detachable RF transmitting/receiving element are used to represent the plurality of RF transmitting/receiving elements 102. The RF switch 106 receives a radiofrequency signal RS through an RF terminal 106a, and then transmits the radiofrequency signal RS to the first RF transmitting/receiving element 102a through an RF terminal 106b or to the external RF connector 102b through an RF terminal 106c.

It is to be noted that the term "detachable RF transmitting/receiving element" means that the RF transmitting/receiving element is not a built-in device, but is connected to the RF device via an external RF connector. Furthermore, the term "detachable" does not limit the way how the RF transmitting/receiving element is coupled to the external RF connector. For example, they may be coupled by way of plugging, engagement, soldering, or the like.

On a default condition that the first RF transmitting/receiving element 102a is connected for transmitting/receiving the radiofrequency signal RS in the RF circuit 100b, the RF terminal 106a of the RF switch 106 originally couples to the RF terminal 106b. Moreover, once a detachable RF transmitting/receiving element is connected to the external RF connector 102b, the RF terminal 106a would be switched to couple to the RF terminal 106c. Furthermore, a test point TP is monitored for determining whether a detachable RF transmitting/receiving element is connected to the external RF connector 102b or not. The test point TP is driven by a testing wire extending from the testing circuit 150, and will be described in more detail later.

Figure 2A:
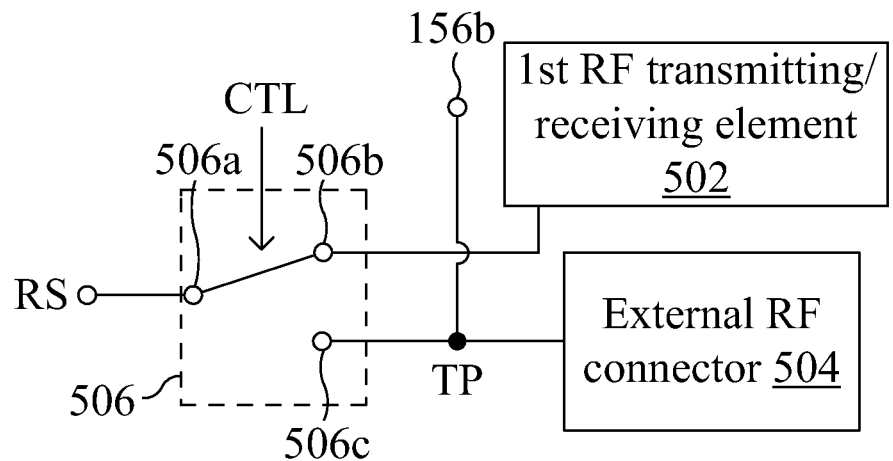
FIG. 2A is a schematic diagram illustrating an example of the RF circuit as shown in FIG. 1B, wherein the test point TP is coupled between a terminal of the RF switch and the external RF connector.
Figure 2B:
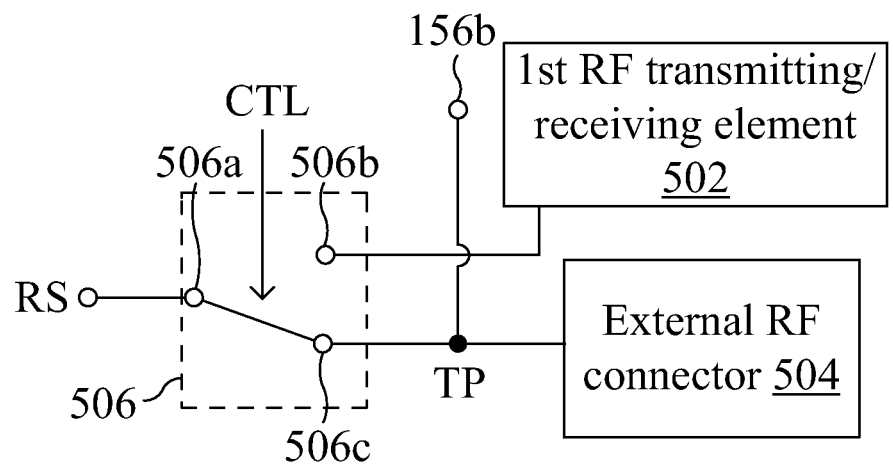
FIG. 2B is a schematic diagram illustrating the RF switch as shown in FIG. 2A, which is in another electric connection state.

Please refer to FIGS. 2A and 2B, which schematically illustrate an example of the RF circuit as shown in FIG. 1B, wherein the test point TP is coupled between a terminal 506c of the RF switch 506 and the external RF connector 504. As shown in FIG. 2A, the RF switch 506 is an electronic type of single gate switch, whose RF terminal 506a is optionally switched to selectively couple to either the RF terminal 506b or the RF terminal 506c under the contents of the control signal CTL. At the initial operational status of the RF circuit 100a, the RF terminal 506a of the RF switch 506 is preset to electrically couple to the RF terminal 506b. Accordingly, the RF circuit 100a may transmit or receive RF signals RS via the first RF transmitting/receiving element 502. Once a second RF transmitting/receiving element (not shown) is connected to the external RF connector 504, an electric level of the signal received at the input terminal 158a would be changed. Therefore, the testing circuit 150 can be used to verify the connection by detecting an electric characteristic at the test point TP. Afterwards, the test-result informing unit 158 issues a control signal CTL according to the electric level of the signal detected through the terminal 158a. In response to the control signal CTL, RF terminal 506a of the RF switch 506 is switched to electrically couple to the terminal 506c, as shown in FIG. 2B, so that the RF switch 506 is electrically coupled to the external RF connector 504 and may transmit or receive RF signals via the second RF transmitting/receiving element.

FIG. 2B illustrates another connection state of the RF circuit, wherein the terminal 506a of the RF switch 106 is electrically coupled to the terminal 506c, and the second RF transmitting/receiving element is used to transmit/receive the radiofrequency signal RS. If the second RF transmitting/receiving element is connected to the RF switch 106 but drops from the external RF connector 504 later, or the circuit associated with the external RF connector 504 is abnormally open-circuit or short-circuit, the testing circuit 150 would determine the abnormal connection state at the test point TP by detecting an electric characteristic change of a specified signal passing through the external input terminal 158a. Under such circumstance, the testing-result informing unit 158 would issue a control signal CTL to have the connection of the terminal 506a switched from the terminal 506c to the terminal 506b as shown in FIG. 2A. Since the terminal 506a becomes electrically coupled to the terminal 506b once the abnormal electric characteristic at the test point happens, the first RF transmitting/receiving element 502, instead of the second RF transmitting/receiving element, is used to transmit/receive the radiofrequency signal RS.

Figure 3A:
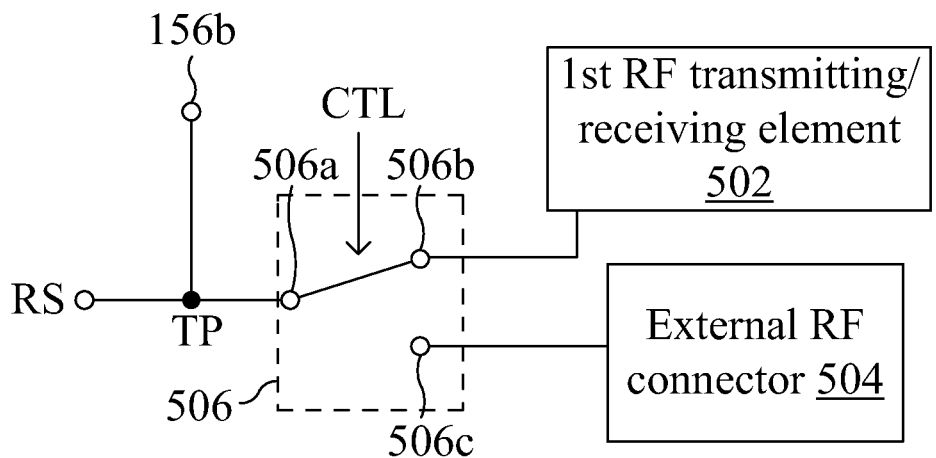
FIG. 3A is a schematic diagram illustrating another example of the RF circuit as shown in FIG. 1B, wherein the test point TP is coupled to an input terminal of the RF switch.
Figure 3B:
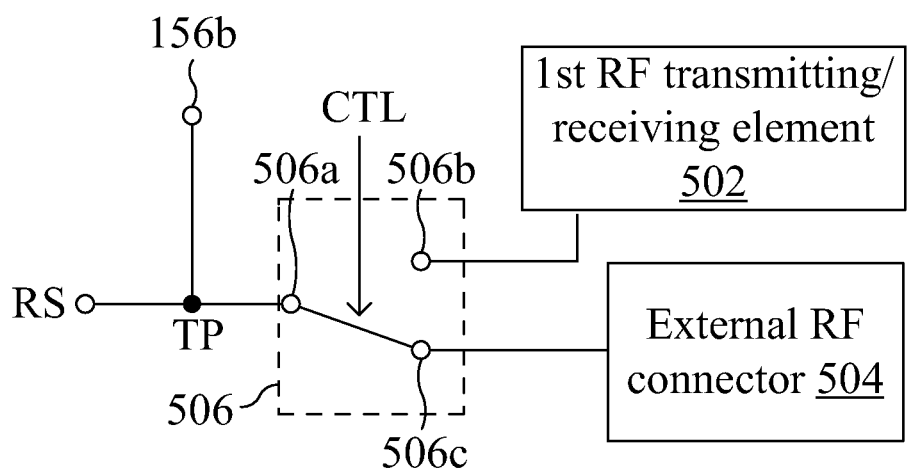
FIG. 3B is a schematic diagram illustrating the RF switch as shown in FIG. 3A, which is in another electric connection state.

Please refer to FIGS. 3A and 3B, which schematically illustrate another example of the RF circuit as shown in FIG. 1B, wherein the test point TP is coupled to an input terminal of the RF switch. In this example, when the terminal 506a of the RF switch 506 is electrically coupled to the terminal 506b and further to the first RF transmitting/receiving element 502, the circuit detected by the testing circuit 150 includes the first RF transmitting/receiving element 502, the circuit between the first RF transmitting/receiving element 502 and the RF switch 506, and the circuit electrically coupled to the terminal 506a of the RF switch 506.

On the other hand, when the terminal 506a of the RF switch 506 is electrically coupled to the terminal 506c and further to the external RF connector 504 due to the insertion and electric connection of an external RF transmitting/receiving element to the external RF connector 504, as shown in FIG. 1B, the circuit detected by the testing circuit 150 includes the external RF connector 504, the circuit between the external RF connector 504 and the RF switch 506, and the circuit electrically coupled to the terminal 506a of the RF switch 506. Furthermore, the connection status and the inner circuit of the external RF connector 504 and the external RF transmitting/receiving element can be detected by the testing circuit 150. Since the external RF transmitting/receiving element can also be tested simultaneously, whether the external RF transmitting/receiving element is in a normal operational status can be determined by detecting an electric characteristic at the test point TP.

Figure 4A:
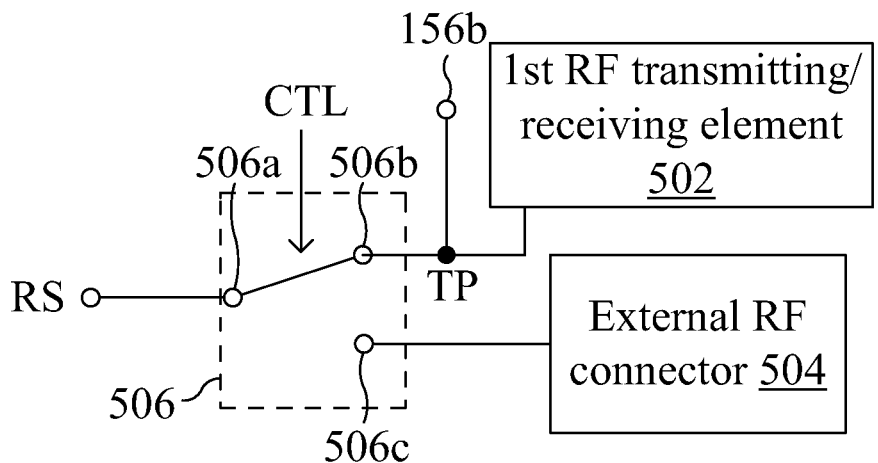
FIG. 4A is a schematic diagram illustrating a further example of the RF circuit as shown in FIG. 1B, wherein the test point TP is coupled between a terminal of the RF switch and a built-in transmitting/receiving element.
Figure 4B:
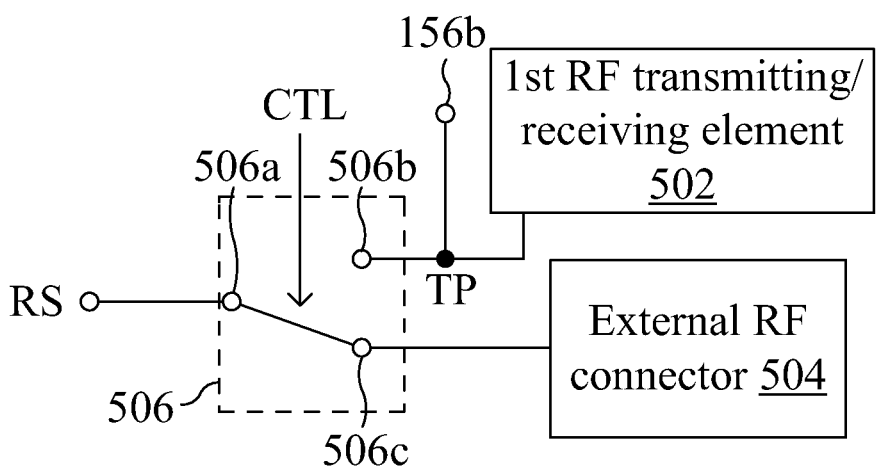
FIG. 4B is a schematic diagram illustrating another electric connection state of the RF switch as shown in FIG. 4A.

FIG. 4A schematically illustrates a further example of the RF circuit as shown in FIG. 1B, wherein the test point TP is coupled between a terminal 506b of the RF switch 506 and a built-in transmitting/receiving element 502. FIG. 4B schematically illustrates another electric connection status of the RF switch as shown in FIG. 4A. In this example, the first RF transmitting/receiving element 502 is the default transmitting/receiving element for transmitting/receiving the radiofrequency signal RS. In other words, the terminal 506a of the RF switch 506 is preset to electrically couple to the terminal 506b. If the first RF transmitting/receiving element 502 is abnormal, e.g. in an open-circuit or short-circuit status, the testing circuit 150 would determine that the first RF transmitting/receiving element 502 is in the abnormal connection status according to an electric characteristic change of a specified signal happening at the test point TP, wherein the specified signal passes through the external input terminal 158a. Under such circumstance, the testing-result informing unit 158 would issue a control signal CTL to have the connection of the terminal 506a switched from the terminal 506b to the terminal 506c as shown in FIG. 4B. Furthermore, after the first RF transmitting/receiving element 502 is repaired, the electric characteristic detected at the test point TP by the testing circuit 150 shows the finished repairment of the first RF transmitting/receiving element 502. Meanwhile, the testing-result informing unit 158 would issue a control signal CTL to switch the connection of the terminal 506a from the terminal 506c back to the terminal 506b as shown in FIG. 4A. The first RF transmitting/receiving element 502 can thus be used to transmit/receive the radiofrequency signal RS again.

In view of the foregoing, if only the circuitry of the first RF transmitting/receiving element 502 is to be detected, the test point TP can be allocated as shown in FIG. 4B. If it is the circuitry inside and/or associated with the external RF connector 504 to be detected, including the external RF transmitting/receiving element connected to the external RF connector 504, the test point TP can be allocated as shown in FIG. 2A. On the other hand, if the circuitry associated with the transmission/receiving of the RF signal RS is to be detected, the test point TP can be allocated as shown in FIG. 2B, 3A, 3B or 4A.

In spite only one built-in RF transmission/receiving element and only one external RF connector are exemplified in the above embodiments and shown in the figures, similar idea of the present invention can be applied to an RF device involving more than one built-in RF transmission/receiving element and/or more than one external RF connector. In the case of a plurality of built-in RF transmission/receiving elements and/or external RF connectors, the test circuit 150 can detect electric characteristics at a variety of test points TP to realize corresponding circuitry status, for example, in a time-division way. Hereinafter, details of the operations of the testing circuit 150 will be described.

Please refer to FIG. 1A. The testing-signal generating unit 152 has a signal output 152a, from which a testing signal Ts is outputted. The testing-signal smoothing unit 154 has a terminal 154a electrically coupled to the testing-signal generating unit 152 for receiving the testing signal Ts. The first filter unit 156 has an external terminal 156a, which is referred to as a first external terminal, and an external terminal 156b, which is referred to as a second external terminal, wherein the first external terminal 156a is electrically coupled to the terminal 154a of the testing-signal smoothing unit 154 and the signal output 152a so as to receive the testing signal Ts, while the second external terminal 156b is electrically coupled to a predetermined test point of the RF circuit 100a. The testing-result informing unit 158 has an external input 158a, which is electrically coupled to the terminal 154a of the testing-signal smoothing unit 154, the signal output 152a, and the external terminal 156a. The testing-result informing unit 158 generates a control signal CTL according to an electric level at the external input 158a.

Preferably, the testing-signal generating unit 152 exhibits properties of a low output impedance voltage source or a high output impedance current source. The testing signal Ts may be a digital signal or it may include a digital signal. For example, the testing signal Ts may be continuously high, like a constant DC voltage. In other words, it is a digital signal, each bit of which is "1". In another example, the testing signal Ts may be continuously low, like a DC grounded voltage. In other words, it is a digital signal, each bit of which is "0". Alternatively, the testing signal Ts may be alternately high and low, like a middle or low frequency signal. In other words, it is a digital signal having alternate "1" and "0" bits, i.e. 1, 0, 1, 0, 1, 0 . . . . Furthermore, a variety of digital signals having different duty cycles and/or waveforms can also be used as the testing signal. The waveforms, for example, may be but not limited to square waves, triangle waves or sine waves.

Furthermore, the first filter unit 156 exhibits properties of high impedance at high frequency and low impedance at middle or low frequency. The so-called high frequency indicates a specific band around the frequency of the radio-frequency signal, which is generally higher than about 300 MHz, and will be referred to as "high band" hereinafter. On the other hand, the so-called middle or low frequency indicates a specific test band around the frequency of the testing signal Ts generated by the testing-signal generating unit 152, which is generally lower than a quarter of the high band frequency, and will be referred to as "middle/low band" hereinafter. As such, during the operation of the radio-frequency (RF) circuit 100a, the RF signal transmitted in the RF circuit 100a would not affect the operation of the testing circuit 150 due to the blocking effect of the first filter unit 156. In contrast, the first filter unit 156 will not block the testing signal Ts, so the RF circuit 100a serves one of the transmission paths of the testing signal Ts. Consequently, the impedance change of the RF circuit 100a will cause a change of an electric level of the testing circuit 150, e.g. the electric level received by the testing-result informing unit 158 through the external input 158a.

The testing-signal smoothing unit 154 used herein functions for temporary energy storage and wave filtration for smoothing the waveform of the testing signal passing therethrough. Depending on practical designs, the testing-signal smoothing unit 154 may stand alone or be incorporated into a filter unit of the testing circuit 150. Embodiments and examples will be given as follows for illustrating the designs and modifications.

Figure 5:
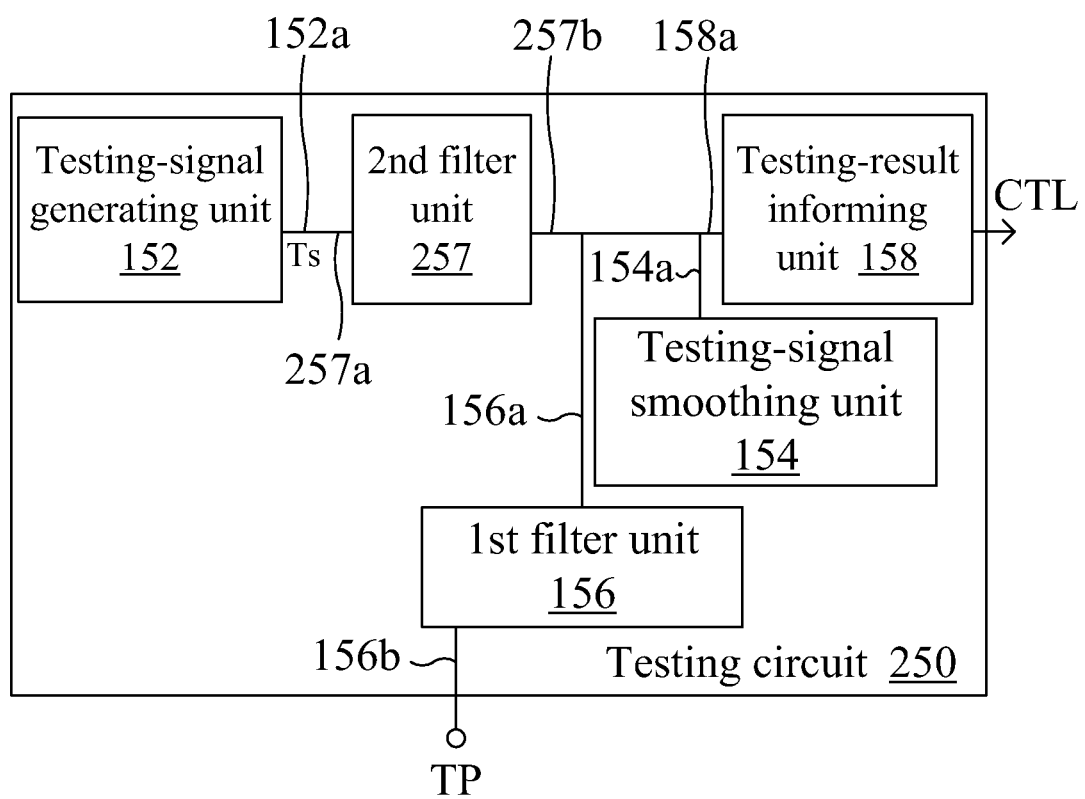
FIG. 5 is a schematic circuit block diagram illustrating an example of a testing circuit of an RF device according to another embodiment of the present invention.

Please refer to FIG. 5, which is a schematic circuit block diagram illustrating an example of a testing circuit of an RF device according to another embodiment of the present invention. Comparing the embodiment illustrated in FIG. 5 with that illustrated in FIG. 1A, the testing circuit 250 of the RF device 20 shown in FIG. 5 includes a second filter unit 257, which does not exist in the RF device 10 shown in FIG. 1A. The second filter unit 257 is electrically coupled to the first filter unit 156 and the testing-signal generating unit 152, and has an external terminal 257a, which is referred to as a third external terminal, electrically coupled to the testing-signal generating unit 152 for receiving the testing signal Ts, and an external terminal 257b, which is referred to as a fourth external terminal, electrically coupled to the external terminal 156a of the first filter unit 156 and the external input 158a of the testing-result informing unit 158. The second filter unit 257 is capable of providing an improved high-frequency isolating effect for the testing-signal generating unit 152 so as to protect the operation of the testing-signal generating unit 152 from being affected by the RF signal transmitted in the high-power RF circuit 100a. The second filter unit 257 accomplishes the aforementioned objective with a required impedance effect in the specified high band. Preferably, the second filter unit 257 provides an impedance effect similar to or better than the first filter unit 156. From another viewpoint, both the first filter unit 156 and the second filter unit 257 can be low-pass filters or band-pass filters. Alternatively, they may be one low-pass filter and one band-pass filter. As long as the objectives can be achieved, it is not intended to limit the types of the filter units.

In addition to the abovementioned difference, the circuitry and operational principle of the testing circuit 250 are similar to the testing circuit 150 illustrated in FIG. 1A, so they will not be redundantly described herein. It is to be noted that in spite a testing-signal generating unit is provided in each of the embodiments for generating a testing signal, the testing signal can alternatively be provided by an external device. Then there would be no need to dispose a testing-signal generating unit in the testing circuit or even in the RF circuit.

Figure 6:
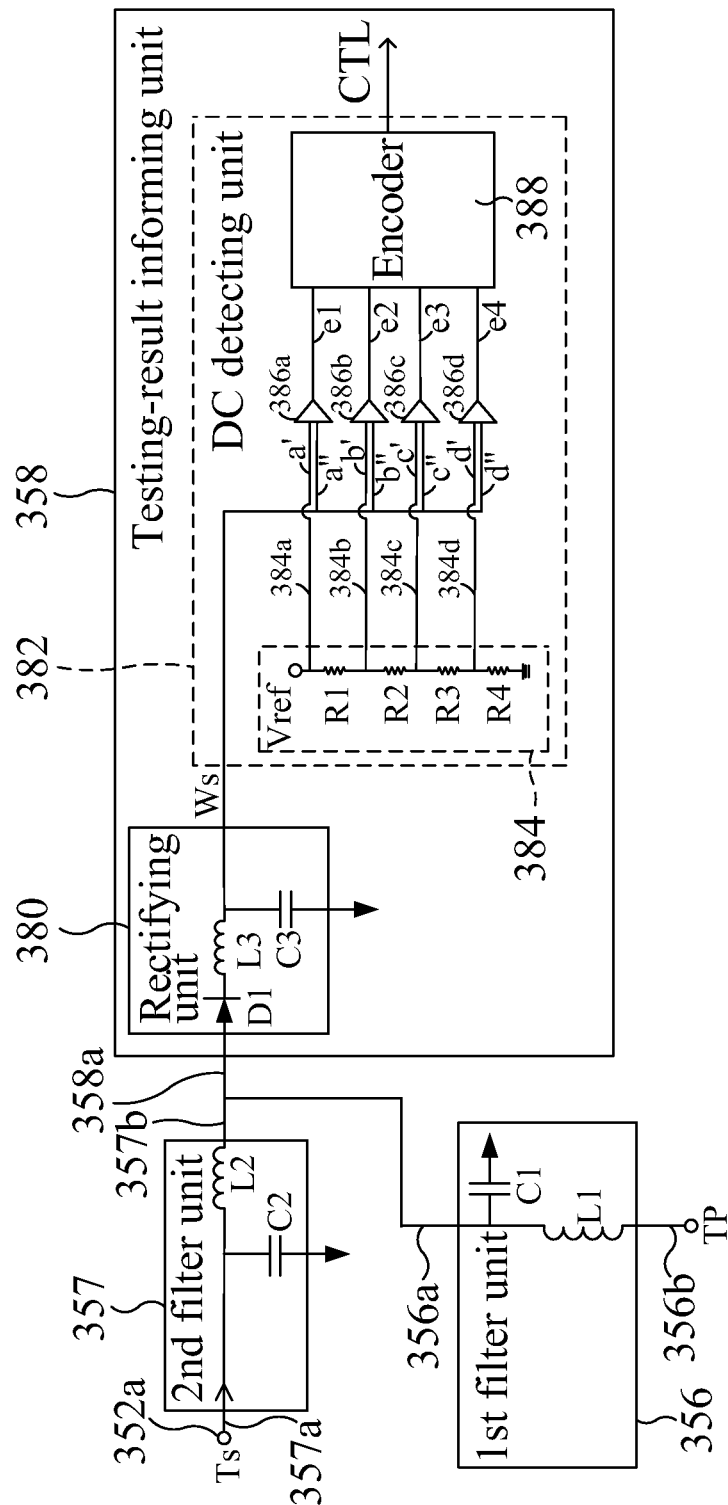
FIG. 6 is a circuit diagram illustrating another example of a testing circuit of an RF device according to another embodiment of the present invention.

For example, referring to FIG. 6, a circuit block diagram schematically illustrating an RF device according to another embodiment of the present invention is shown. In this embodiment, the testing circuit 35 mainly includes a signal output 352a, a first filter unit 356, a second filter unit 357 and a testing-result informing unit 358, and there is no independent testing-signal generating unit included in this embodiment of RF device. Instead, the signal output 352a is electrically coupled to an external testing-signal generating unit (not shown), from which the testing signal Ts is received and provided for the testing circuit 35.

In this embodiment, the first filter unit 356 includes an inductor L1 and a capacitor C1. The inductor L1 has one terminal electrically coupled to the external terminal 356b and then to a testing point TP of the RF circuit (not shown). Another terminal of the inductor L1, i.e. the external terminal 356a of the first filter unit 356, one terminal of the capacitor C1, the external terminal 357b of the second filter unit 357 and the external input 358a of the testing-result informing unit 358 are electrically coupled to one another. Another terminal of the capacitor C1 is electrically coupled to ground. The second filter unit 357 includes an inductor L2 and a capacitor C2. One terminal of the inductor L2, i.e. the external terminal 357a of the second filter unit 357, is electrically coupled to the signal input 352a and one terminal of the capacitor C2. Another terminal of the inductor L2, i.e. the external terminal 357b of the second filter unit 357, is electrically coupled to the external input 358a of the testing-result informing unit 358 and the external terminal 356a of the first filter unit 356. Another terminal of the capacitor C2 is electrically coupled to ground.

Figure 7:
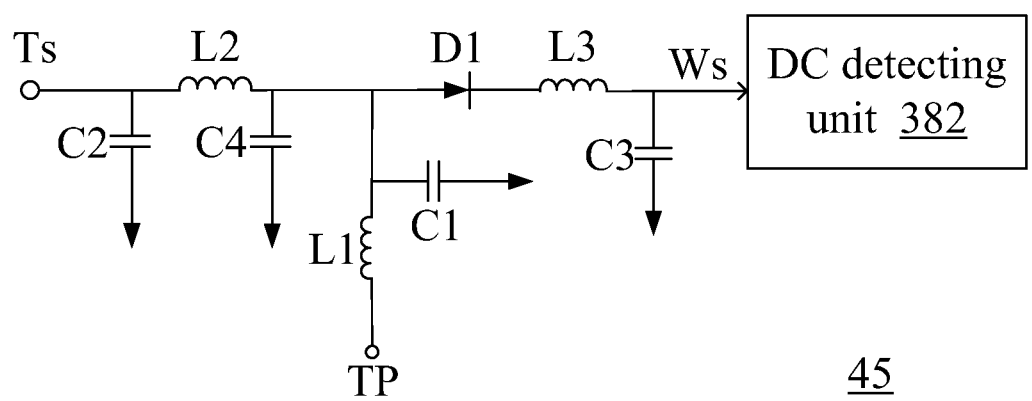
FIG. 7 is a circuit diagram illustrating a further example of a testing circuit of an RF device according to another embodiment of the present invention.

Herein, the capacitors C1 and C2 work together as the testing-signal smoothing unit 154 as shown in FIG. 1A. That is, the capacitors C1 and C2 work together to provide temporary energy-storing and wave-filtering effects for providing a direct-current (DC) bias signal required by the testing-result informing unit 358 at a subsequent stage. Another alternative example of the RF device is illustrated in FIG. 7, in which an additional capacitor C4 is included in the testing circuit 45, compared to the testing circuit 35. In the embodiment as illustrated in FIG. 7, the capacitor C4 functions like the testing-signal smoothing unit 154. That is, the capacitor C4 works to provide temporary energy-storing effect for providing a direct-current (DC) bias signal required by the testing-result informing unit 358 at a subsequent stage. Of course, the capacitors C1 and C2 also provide temporary energy-storing and wave-filtering effects. By adjusting the capacitance of the independent capacitor C4, a level of the direct-current (DC) bias signal required by the testing-result informing unit 358 at a subsequent stage can be changed without changing the wave-filtering effect.

Please refer to FIG. 6 again. As shown, the testing-result informing unit 358 in this embodiment includes a rectifying unit 380 and a DC detecting unit 382. The rectifying unit 380 is electrically coupled to the external input 358a, performs a rectifying operation for the electric level at the external input 358a, and outputs a corresponding rectified signal Ws. The DC detecting unit 382 is electrically coupled to the rectifying unit 380, receives the rectified signal Ws, and determines the contents of the control signal CTL to be outputted by the testing-result informing unit 358 according to the rectified signal Ws.

In this embodiment, the rectifying unit 380 includes a diode D1, an inductor L3 and a capacitor C3. The anode of the diode D1 is electrically coupled to the external input 358a, and the cathode is electrically coupled to one terminal of the inductor L3. Another terminal of the inductor L3 is electrically coupled to one terminal of the capacitor C3, and another terminal of the capacitor C3 is grounded. The DC detecting unit 382 includes a voltage divider 384, a plurality of comparator 386a~386d and an encoder 388. It is to be noted that although a half-wave rectifier is exemplified as the rectifying unit in the above embodiments, as understood by those skilled in the art, another type of rectifying unit such as a full-wave rectifier or a bridge rectifier, can be used in the embodiments in lieu of the half-wave rectifier.

The voltage divider 384 has a first operational voltage input terminal Vref and a plurality of partial voltage output terminals 384a~384d. For making respective voltage values provided through the partial voltage output terminals 384a~384d different from one another, resistors R1~R4 are serially connected between the first operational voltage input terminal Vref and the ground in the voltage divider 384. Meanwhile, partial voltages are provided from coupling points between respective pairs of adjacent resistors to the partial voltage output terminals 384a~384d.

The comparators 386a~386d have respective reference input terminals a'~d', comparative input terminals a"~d" and comparative output terminals e1~e4. In more detail, the reference input terminal a' of the comparator 386a is electrically coupled to the corresponding partial voltage output terminal 384a, the rectifying signal Ws is received through the comparative input terminal a", and a compared result between the voltage at the partial voltage output terminal 384a and the voltage of the rectifying signal Ws is provided from the comparator 386a to the encoder 388 via the comparative output terminal e1. Likewise, the reference input terminal b' of the comparator 386b is electrically coupled to the corresponding partial voltage output terminal 384b, the rectifying signal Ws is received through the comparative input terminal b", and a compared result between the voltage at the partial voltage output terminal 384b and the voltage of the rectifying signal Ws is provided from the comparator 386b to the encoder 388 via the comparative output terminal e2. The reference input terminal c' of the comparator 386c is electrically coupled to the corresponding partial voltage output terminal 384c, the rectifying signal Ws is received through the comparative input terminal c", and a compared result between the voltage at the partial voltage output terminal 384c and the voltage of the rectifying signal Ws is provided from the comparator 386c to the encoder 388 via the comparative output terminal e3. The reference input terminal d' of the comparator 386d is electrically coupled to the corresponding partial voltage output terminal 384d, the rectifying signal Ws is received through the comparative input terminal d", and a compared result between the voltage at the partial voltage output terminal 384d and the voltage of the rectifying signal Ws is provided from the comparator 386d to the encoder 388 via the comparative output terminal e4.

In an initial test, the settings of the comparators 386a~386d are adjusted by properly adjusting resistance correlation among the resistors R1~R4. The encoders 388 then obtains desired compared results for determination of the contents of the control signal CTL according to the settings of the comparators 386a~386d and the rectifying signal Ws. In other words, the comparators 386a~386d are properly set and adjusted to have the control signal CTL meet the variable conditions of the RF circuit 100a. Alternatively, the contents of the control signal CTL generated by the encoder 388 may be determined according to the compared results, which are inputted to the encoder 388 corresponding to different conditions of the RF circuit 100a based on default values of other comparators. It is to be noted that this alternative way is adapted for a condition that similar tests have been made and accuracy has been assured. For example, it is suitable for a batch test during mass production, or for a maintenance test after being sold to a user.

Generally, the duty cycle of the testing signal Ts varies with the RF circuits to be tested. A proper testing signal Ts would make it possible to differentiate the rectifying signals Ws resulting from a normal RF circuit or an abnormal RF circuit, thereby generating differentiable contents of the control signal CTL. Accordingly, whether the impedance of the tested RF circuit is normal can be determined based on the contents of the control signal CTL.

Hereinafter, three conditions are given as examples to adjust the testing signal Ts until it is proper to differentiate contents of the control signal CTL. The three conditions include Condition 1: no external RF transmitting/receiving element being connected to the external RF connector; Condition 2: the second RF transmitting/receiving element being successfully connected to the external RF connector; and Condition 3: the first RF transmitting/receiving element operating normally.

In Condition 1, a preliminary test is made provided that no external RF transmitting/receiving element is connected to the external RF connector in order to obtain a specific sequence, hereinafter a first conditional sequence. The first conditional sequence is constituted from the compared results outputted from the comparators. If the target to be tested includes another element in the RF circuit, the electric connection state can be allocated as illustrated in FIG. 2B or 3B. Afterwards, the test is conducted to generate a resulting sequence, hereinafter a first sub-sequence value. On the other hand, if the target to be tested does not include any other element of the RF circuit, the electric connection state can be allocated as illustrated in FIG. 2A. Afterwards, the test is conducted to generate a resulting sequence, hereinafter a second sub-sequence value. The two specific sequences may be inconsistent to each other. In other words, the first sub-sequence value and the second sub-sequence value may be different when the electric connection states are different.

In Condition 2, a preliminary test is made provided that the second RF transmitting/receiving element is successfully connected to the external RF connector to obtain a specific sequence, hereinafter a second conditional sequence, constituted from the compared results outputted from the comparators. If the target to be tested includes another element of the RF circuit, the electric connection state as illustrated in FIG. 2B or 3B can be allocated. Afterwards, the test is conducted to generate a resulting sequence, hereinafter a third sub-sequence value. On the other hand, if the target to be tested does not include any other element of the RF circuit, the electric connection state as illustrated in FIG. 2A can be allocated. Afterwards, the test is conducted to generate a resulting sequence, hereinafter a fourth sub-sequence value. The two specific sequences may be inconsistent to each other. In other words, the third sub-sequence value and the fourth sub-sequence value may be different when the electric connection states are different.

In Condition 3, a preliminary test is made under a condition that the first RF transmitting/receiving element operates normally to obtain a specific sequence, hereinafter a third conditional sequence, constituted from the compared results outputted from the comparators. If the target to be tested includes another element of the RF circuit, the electric connection state can be allocated as illustrated in FIG. 3A or 4A. Afterwards, the test is conducted to generate a resulting sequence, hereinafter a fifth sub-sequence value. On the other hand, if the target to be tested does not include any other element of the RF circuit, the electric connection state can be allocated as illustrated in FIG. 4B. Afterwards, the test is conducted to generate a resulting sequence, hereinafter a sixth sub-sequence value. Likewise, the fifth sub-sequence value and the sixth sub-sequence value may be different.

The testing signal Ts is adjustable in order to have the compared results outputted by the comparators comply with specific sequences, e.g. 0001, 0101, etc. Accordingly, the contents of the control signal CTL can be differentiated in response to the properly adjusted testing signal Ts.

Alternatively, the compared results outputted by the comparators may be made to comply with specific sequences by adjusting the DC bias voltage of the testing-result informing unit 358 or the arrangement of the resistors R1~R4, instead of adjusting the testing signal Ts. For example, a part or all of the resistors R1~R4 are variable resistors. Once a specific condition is complied with so as to generate the first, second and third conditional sequences based on the compared results in the three examples, respectively, the specific condition can be used for subsequent tests, and the first, second and third conditional sequences can be used as references to analyze subsequent compared results of the comparators.

For example, assume the first conditional sequence is 0000, the second conditional sequence is 0011 and the third conditional sequence is 1001 under an adjusted specific condition, and assume that the first sub-sequence value is identical to the second sub-sequence value, the third sub-sequence value is identical to the fourth sub-sequence value, and the fifth sub-sequence value is identical to the sixth sub-sequence value. In a subsequent test under the same specific condition, it would be determined that there is no external RF transmitting/receiving element connected to the external RF connector when the output sequence matches the first conditional sequence 0000; it would be determined that there is an external RF transmitting/receiving element successfully connected to the external RF connector when the output sequence matches the second conditional sequence 0011; and it would be determined that the electric feature of the first RF transmitting/receiving element operates normally when the output sequence matches the third conditional sequence 1001.

By way of the above-described matching rules, a condition of the RF circuit can be determined. Meanwhile, an electric connection state of the RF circuit under a specific condition can also be determined. If it is determined that the RF circuit is not successfully connected, a corresponding control signal CTL will be issued to control the operation of the RF switch. In addition, alarm means can be activated in response to the control signal CTL. For example, the alarm means may be, but not limited to, lighting or sound.

It can be understood from the above descriptions, an RF circuit can be detected with a testing circuit according to the above embodiments. The detected results can be referred to for determining a status of the RF circuit. Moreover, the RF circuit can be automatically adjusted according to the detected results, and/or notification or alarm can be automatically issued for check and maintenance.

Figure 8:
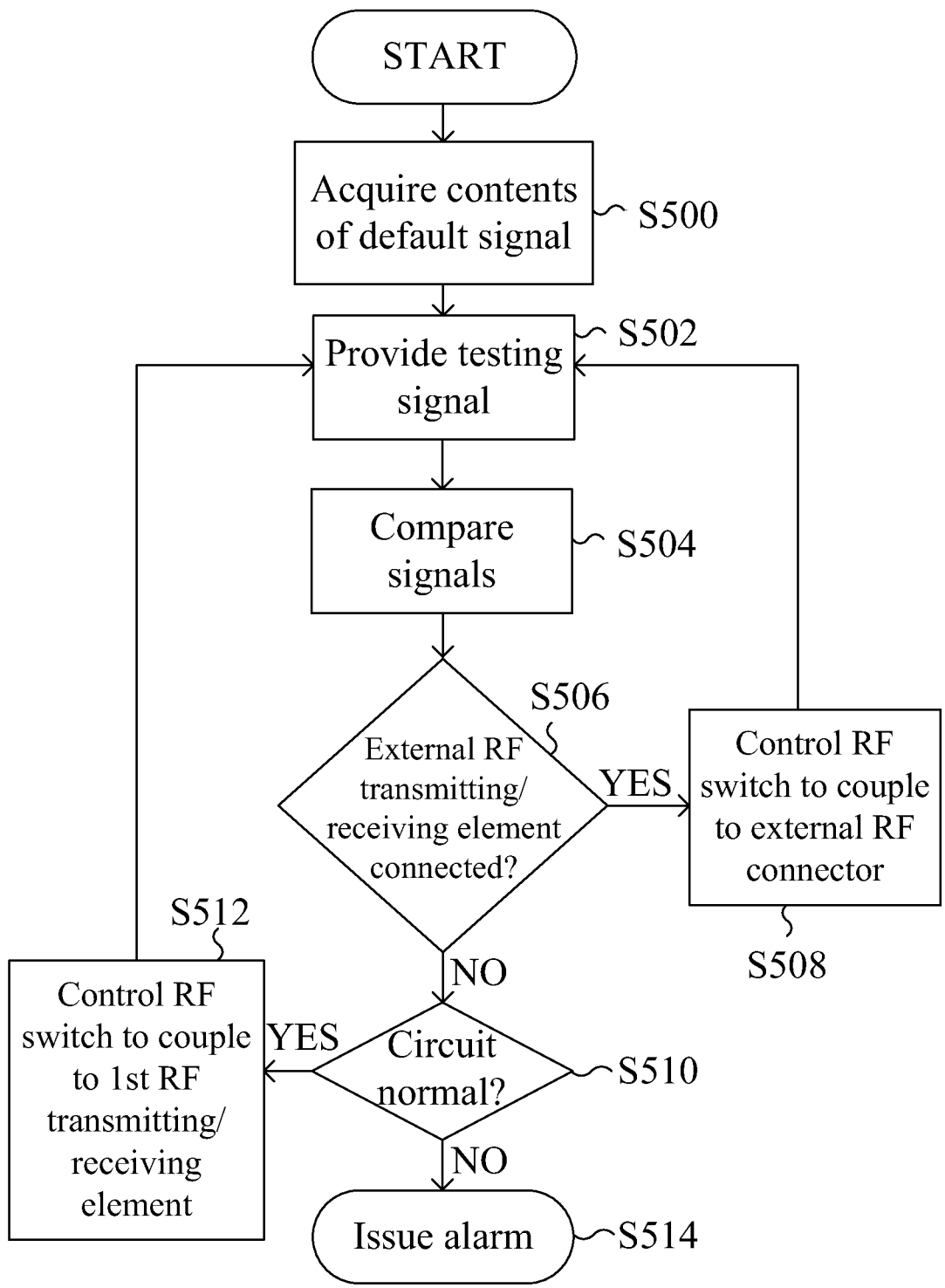
FIG. 8 is a flowchart schematically illustrating a modulating method of an RF device according to an embodiment of the present invention.

Please refer to FIG. 8. A testing method according to the present invention is described with reference to the flowchart. In this embodiment, the first RF transmitting/receiving element 102a as shown in FIG. 1B is preset to be the transmission path for transmitting/receiving the radiofrequency signal RS. Afterwards, once the external RF connector 102b is coupled thereto a normal external RF transmitting/receiving element, the radiofrequency signal RS will be transmitted/received through the external RF transmitting/receiving element instead of the first RF transmitting/receiving element 102a.

First of all, in Step S500, contents of a default signal is acquired. During the first test, a result derived from a theoretical electric characteristic can be used as the contents of the default signal. Alternatively, a real test result, e.g. the first, second or third conditional sequence as mentioned above, may be used as the contents of the default signal. The default signal can be stored in any suitable position of the RF device. For example, it can be stored in the testing circuit 150, and specifically, in the testing-signal generating unit 152 or the testing-result informing unit 158 to be readily provided for subsequent comparing operations.

After the contents of the default signal are acquired, the testing signal can be provided (Step S502) and signal comparison can be conducted (Step S504). Since the first RF transmitting/receiving element 102a as shown in FIG. 1B is preset, in this embodiment, to be a part of the transmission path for transmitting/receiving the radiofrequency signal RS, step S506 is executed to discriminate if there is any external RF transmitting/receiving element connected to the external RF connector 102b. Meanwhile, the preliminary test under Condition 2 is executed. In other words, in Step S506, whether the compared results outputted by the comparators comply with the third sub-sequence value or the fourth sub-sequence value is determined. Which of the third sub-sequence value and the fourth sub-sequence value is used as the reference depends on the position of the test point. For example, if the electric connection state is as shown in FIG. 2A, i.e. the test point TP is between the terminal 506c of the RF switch 506, and the external RF connector 504 and the RF terminal 506a is preset to be electrically coupled to the RF terminal 506b, the fourth sub-sequence value is used as the reference. On the other hand, if the electric connection state is as shown in FIG. 2B, i.e. the test point TP is between the terminal 506*c* of the RF switch 506 and the external RF connector 504, and the RF terminal 506*a* is preset to be electrically coupled to the RF terminal 506*c*, the third sub-sequence value is used as the reference.

In another example, if successful coupling of an external RF transmitting/receiving element to the external RF connector 504 is detected in Step S506, the flow will proceed to Step S508 so that the transmission path is changed to the external RF connector 504 instead of the built-in RF transmitting/receiving element 502 by having the RF terminal 506*a* couple to the RF terminal 506*c*.

On the contrary, if it is determined in Step S506 that no external RF transmitting/receiving element is coupled to the external RF connector 504, the flow will proceed to Step S510, wherein whether the circuit preset to be used is normal or not is determined. It is understood that the above descriptions relate to the test under Condition 3. In another point of view, since the first RF transmitting/receiving element 502 as shown in FIG. 2A is preset to be a part of the transmission path for transmitting/receiving the radiofrequency signal RS, the position of the test point TP as shown FIG. 3A or 4A, as well as the electric connection state, is feasible. In other words, the fifth sub-sequence value would be the suitable reference. If the compared results of the comparators are consistent to the fifth sub-sequence value, it means that the entire circuit associated with the transmission/receiving of the radiofrequency signal RS via the first RF transmitting/receiving element 502 operates normally. If the compared results of the comparators are not consistent to the fifth sub-sequence value, it is determined that the entire circuit associated with the transmission/receiving of the radiofrequency signal RS via the first RF transmitting/receiving element 502 does not operate normally.

Assume that it is the RF terminal 506*c* electrically coupled to the RF terminal 506*a* inside the RF switch 506 when the flow proceeds to Step S510. For detecting if the preset transmission path runs normally, the position of the test point TP and the electric connection state of the RF switch 506 are as shown in FIG. 4B. Therefore, the sixth sub-sequence value would be the reference used in Step S510. In other words, if the compared results of the comparators are consistent to the sixth sub-sequence value, it means that the first RF transmitting/receiving element 502 operates normally. If the compared results of the comparators are not consistent to the sixth sub-sequence value, it is determined that the first RF transmitting/receiving element 502 does not operate normally.

Those skilled in the art would understand that although the sub-sequence value is used as the reference for determining the test result, as described above, other parameters associated with respective sub-sequence values, e.g. the corresponding conditional sequences, may also serve as the reference.

Following Step S510, the flow will proceed to Step S512, if the associated circuit operates normally, so that the transmission path remains to go through the built-in RF transmitting/receiving element 502 while the RF terminal 506*a* still couple to the RF terminal 506*b*. On the other hand, if the detected result of the associated circuit shows an abnormal result in Step S510, the flow will proceed to Step S514, and an alarm signal will be issued.

Alternatively, Step S512 may be conducted prior to Step S510. If it is determined that the associated circuit operates normally in Step 510, an additional step may be optionally performed to couple the RF terminal 506*a* of the RF switch to the RF terminal 506*b*. If it is determined that the associated circuit does not operate normally in Step 510, an additional step may be optionally performed to electrically couple the RF terminal 506*a* of the RF switch to a terminal corresponding to a selected normal RF transmitting/receiving element in order to make the transmission of the radiofrequency signal RS as smooth as possible.

Furthermore, it may further determine whether the associated circuit operates normally or not in Step S506. If it determined that the associated circuit does not operate normally, the flow may proceed to Step S514 to issue an alarm signal.

It is to be noted that the above-described specific embodiments are given for illustration only, and those skilled in the art may, for example, adjust the sequence of the steps depending on practical requirement. Since equivalent ways to achieve similar objectives of the present invention are various, they would not be described herein.

In view of the foregoing, the present invention is advantageous in the following aspects. First of all, switching between a built-in RF transmitting/receiving element and an external RF transmitting/receiving element can be automatically performed. Once the electric connection of an external RF transmitting/receiving element to the RF circuit is detected, the testing circuit automatically detects the circuit condition of the external RF transmitting/receiving element. A transmission path through the external RF transmitting/receiving element will be automatically selected if the circuit condition of the external RF transmitting/receiving element is normal. On the contrary, a transmission path through the built-in RF transmitting/receiving element will be selected and an alarm signal can be optionally issued if the circuit condition of the external RF transmitting/receiving element is abnormal. In addition, a test according to the present invention can be applied to an RF circuit with or without power supply, and the test can be performed while the RF circuit is working. If there is any installation failure, it can be detected in the test. Furthermore, the test can be applied to RMA (Return Merchandise Authorization), assembling quality test in the manufacturing process of the RF circuit, and so on. The test according to the present invention does not need any expensive precision instrument. Instead, it can be conducted by way of digital control and switching of the RF circuit.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An RF device, comprising:
    an RF circuit for transmitting or receiving an RF signal, comprising:
        at least two RF transmitting/receiving elements; and
        an RF switch controlled electrically for coupling to one of the RF transmitting/receiving elements to transmit/receive an RF signal in response to a control signal; and
    a testing circuit, comprising:
        a first filter unit having a first external terminal electrically coupled to a testing signal and a second external terminal electrically coupled to the RF circuit, wherein the first filter unit is configured to allow the testing signal to enter the RF circuit while blocking an RF signal transmitted in the RF circuit from entering the testing circuit; and a testing-result informing unit having an external input electrically coupled to the first external terminal, and determining contents of the control signal according to an electric level at the external input.

2. The RF device according to claim 1, wherein the RF transmitting/receiving elements include at least one built-in RF transmitting/receiving element and at least one external RF connector for coupling thereto a detachable RF transmitting/receiving element.

3. The RF device according to claim 1, wherein the testing circuit further comprises:

a second filter unit having a third external terminal electrically coupled to the testing signal and a fourth external terminal electrically coupled to the first external terminal of the first filter unit.

4. The RF device according to claim 1, wherein the testing-result informing unit includes:

a rectifying unit electrically coupled to the external input for rectifying the electric level at the external input to output a rectified signal; and a DC detecting unit electrically coupled to the rectifying unit for receiving the rectified signal, and determining the contents of the control signal according to the rectified signal.

5. The RF device according to claim 4, wherein the DC detecting unit includes:

a voltage divider having a first operational voltage input terminal and a plurality of partial voltage output terminals, wherein each one of the partial voltage output terminals provides a voltage value different from that provided by any other one of the partial voltage output terminals;

a plurality of comparators having respective reference input terminals, comparative input terminals and comparative output terminals, wherein each of the reference input terminals is electrically coupled to a corresponding one of the partial voltage output terminals, each of the comparative input terminals receives therethrough the rectifying signal, and each of the comparative output terminals provides therethrough a compared result between a voltage at a corresponding one of the partial voltage output terminals and a voltage of the rectifying signal; and an encoder determining the contents of the control signal according to the compared results outputted by the comparators.

6. The RF device according to claim 1, further comprising:

a testing-signal generating unit for generating and providing the testing signal.

7. The RF device according to claim 1, further comprising:

a testing-signal smoothing unit having one terminal electrically coupled to the testing signal and the first external terminal of the first filter unit.

8. A method of automatically selecting and switching RF terminals in the RF device as claimed in claim 1, comprising:

comparing an electric level at the external input of the testing-result informing unit with at least one reference electric level to obtain a compared result; and determining the contents of the control signal according to the compared result.

9. The method according to claim 8, wherein the contents of the control signal are determined by comparing the compared result with a conditional sequence, which is previously obtained by comparing the electric level at the external input of the testing-result informing unit with the at least one reference electric level on a condition that a detachable RF transmitting/receiving element is successfully connected to the external RF connector of the RF circuit.

10. The method according to claim 9, wherein the RF switch is controlled, in response to the control signal, to be electrically coupled to the external RF connector so as to have the RF signal transmitted/received through the detachable RF transmitting/receiving element if the compared result is consistent with the conditional sequence.

11. The method according to claim 9, wherein a warning signal is issued if the compared result is inconsistent with the conditional sequence.

12. The method according to claim 8, wherein the contents of the control signal are determined by comparing the compared result with a conditional sequence, which is previously obtained by comparing the electric level at the external input of the testing-result informing unit with the at least one reference electric level on conditions that the RF circuit functions normally and there is no detachable RF transmitting/receiving element connected to the external RF connector of the RF circuit.

13. The method according to claim 12, wherein the RF switch is controlled, in response to the control signal, to be electrically disconnecting to the external RF connector so as to block the RF signal from coupling to the RF connector if the compared result is consistent with the conditional sequence.

14. The method according to claim 12, wherein a warning signal is issued if the compared result is inconsistent with the conditional sequence.

\* \* \* \* \*